US010880136B2

United States Patent
Mayer et al.

(10) Patent No.: US 10,880,136 B2
(45) Date of Patent: Dec. 29, 2020

(54) SYNCHRONIZING A DIGITAL FREQUENCY SHIFT

(71) Applicant: Intel IP Corporation, Santa Clara, CA (US)

(72) Inventors: Christian Mayer, Wilhering (AT); Thomas Mayer, Linz (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/492,801

(22) PCT Filed: Apr. 1, 2017

(86) PCT No.: PCT/US2017/025647
§ 371 (c)(1),
(2) Date: Sep. 10, 2019

(87) PCT Pub. No.: WO2018/182750
PCT Pub. Date: Oct. 4, 2018

(65) Prior Publication Data
US 2020/0059386 A1 Feb. 20, 2020

(51) Int. Cl.
H04L 27/00 (2006.01)
H04L 27/227 (2006.01)
H04L 27/26 (2006.01)
H03D 3/00 (2006.01)

(52) U.S. Cl.
CPC ......... *H04L 27/0014* (2013.01); *H03D 3/009* (2013.01); *H04L 27/2273* (2013.01); *H04L 27/2657* (2013.01); *H04L 2027/003* (2013.01); *H04L 2027/0016* (2013.01); *H04L 2027/0067* (2013.01)

(58) Field of Classification Search
CPC ............ H04L 27/0014; H04L 27/2657; H04L 2027/0016; H04L 27/366; H04L 27/2032
See application file for complete search history.

(56) References Cited

U.S. PATENT DOCUMENTS

| 9,490,826 B1 | 11/2016 | Wang et al. |
| 2005/0207334 A1 | 9/2005 | Hadad |
| 2006/0067429 A1 | 3/2006 | Beyer et al. |

(Continued)

OTHER PUBLICATIONS

PCT International Search Report issued for PCT/US2017/025647, 2 pgs., dated Jun. 21, 2017.

*Primary Examiner* — Aristocratis Fotakis
(74) *Attorney, Agent, or Firm* — Schiff Hardin LLP

(57) ABSTRACT

An apparatus and a method for synchronizing a Digital Frequency Shift (DFS) for a signal to be transmitted over a wireless channel are disclosed. For example, the method, by a synchronizer, transmits a DFS trigger to a Digital Front End (DFE) processor and a Local Oscillator (LO) trigger to an LO in a synchronous manner, the method, by the DFE processor, applies a DFS on received data in response to receiving the DFS trigger, the method, by the LO, applies a complementary shift on a carrier signal in response to receiving the LO trigger, the method, by the upconverter, digital-to-analog converts and radio frequency modulates the digital frequency-shifted received data and the complementary-shifted carrier signal. In another example, the method, by the synchronizer, transmits a phase error to a phase error corrector that performs a phase error correction.

24 Claims, 7 Drawing Sheets

(56) References Cited

U.S. PATENT DOCUMENTS

| | | | |
|---|---|---|---|
| 2007/0058683 A1* | 3/2007 | Futami | H04L 27/0014 370/516 |
| 2007/0160158 A1* | 7/2007 | Zeng | H04L 27/2675 375/260 |
| 2007/0160168 A1* | 7/2007 | Beukema | H04L 27/0014 375/326 |
| 2010/0272208 A1* | 10/2010 | Feigin | H04L 27/3863 375/268 |
| 2012/0263217 A1* | 10/2012 | Gossmann | H04L 27/366 375/224 |
| 2013/0035099 A1 | 2/2013 | Boejer et al. | |
| 2013/0188749 A1* | 7/2013 | Wang | H04L 7/0331 375/296 |
| 2014/0044214 A1* | 2/2014 | Gossmann | H04L 27/2032 375/296 |
| 2014/0369442 A1 | 12/2014 | Huang | |
| 2015/0282171 A1 | 10/2015 | Yu et al. | |
| 2017/0346508 A1* | 11/2017 | Li Puma | H03L 7/0805 |

\* cited by examiner

SYNCHRONIZING A DIGITAL FREQUENCY SHIFT

The present disclosure describes a method and an apparatus for synchronizing a Digital Frequency Shift (DFS). Although, the method is described for synchronizing a DFS in a device transmitting and/or receiving wireless signals over a wireless channel of a Long Term Evolution (LTE) network, the method may be implemented for signals transmitted and/or received over any type of wireless network, e.g., a 3G network, a 5G network, and the like.

BACKGROUND

A User Equipment (UE) may communicate with other network devices via a communication network. For example, a wireless UE may communicate with other wireless or wire based devices via a base station associated with a wireless communications network, e.g., an eNodeB. The UE comprises transmit and receive chains that are configured for enabling the UE to transmit and receive data wirelessly using a wireless signal via one or more antennas. As such, the UE may be referred to as a transmitter when it is transmitting data, and as a receiver when it is receiving data.

The transmit chain includes several components. When the input signal to the device traverses some nonlinear components in the transmit chain, the output includes additional unwanted signals at frequencies other than the frequency of the input signal. For example, harmonics may occur at multiples of the original frequencies and intermodulation products may occur at sums and differences of the original frequencies, and at multiples of the resulting sums and differences of those frequencies.

One approach to reduce the effect of the nonlinearity is to reduce a power level of the unwanted frequencies. For example, the power level of the unwanted intermodulation products may be reduced relative to the power level of the wanted frequencies. However, when the intermodulation products fall into sensitive regions of the frequency spectrum, e.g., within the duplex distance used for simultaneous transmission and reception, removing the unwanted frequencies may require high current consumption.

Another approach to reduce the effect of the nonlinearity is to apply a DFS in a digital baseband transmit chain and compensate for the DFS by applying a complementary shift (i.e., a complementary frequency offset) in the Local Oscillator (LO). However, the signals for applying the DFS and the complementary shift in the LO traverse different propagation paths in the device. Thus, the two shifts (i.e., the DFS and the complementary shift) may not coincide perfectly in order to reproduce an exact copy of the input signal. When the two shifts are applied at different times, a comparison of the signal before the two shifts and after the two shifts may include: an unwanted phase transient, and a static phase difference between the signal before the two shifts and the signal after the two shifts. Hence, schemes that focus on the amount of shift are sub-optimal in reproducing the input signal without phase transients and/or static phase errors.

BRIEF DESCRIPTION OF THE DRAWINGS

The teaching of the present disclosure can be more fully understood by reading the subsequent detailed description and examples in conjunction with references made to the accompanying drawings, in which.

To facilitate reading, identical reference numbers are used to designate elements that are common to various figures, where possible.

DETAILED DESCRIPTION

The present disclosure relates to synchronizing a DFS such that the effect of nonlinearity on transmitted data is reduced. For example, in one aspect of the present disclosure, the DFS may be synchronized in a transmitter wireless device to reduce unwanted phase transients. In another aspect, a phase error may be corrected to remove static phase errors that cause phase discontinuities between consecutive data symbols. Although, the teaching of the present disclosure is described for signals of an LTE network, the apparatus and method of the present disclosure may be implemented for signals of other wireless communication networks, e.g., 3G networks, 5G networks, etc.

Figure 1:
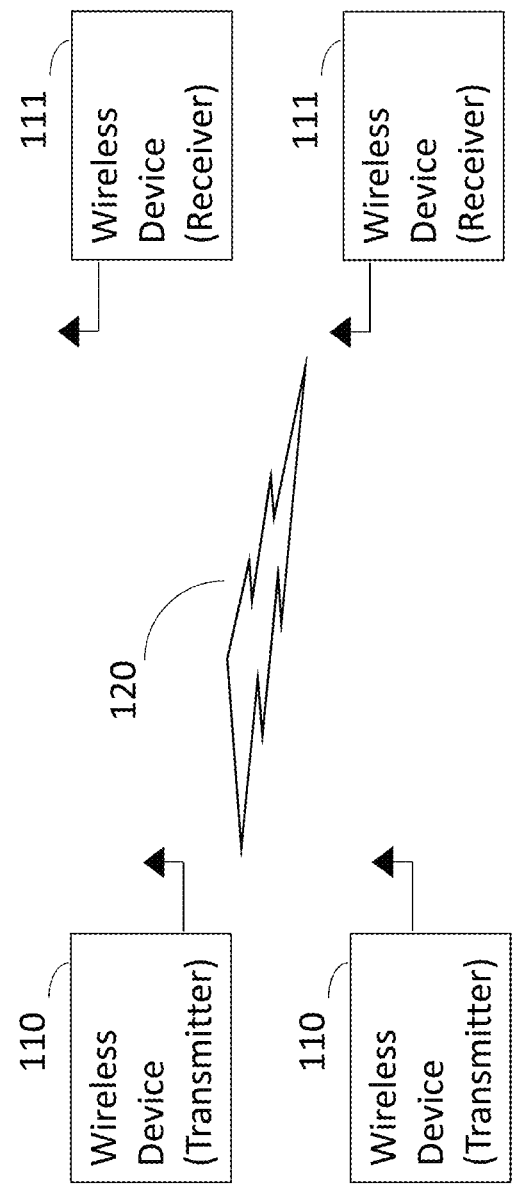
FIG. 1 illustrates an exemplary wireless network for providing services to wireless devices.

FIG. 1 illustrates a wireless network 100 for providing services to wireless devices. The wireless network comprises transmitter wireless devices 110 and receiver wireless devices 111 communicating over a wireless channel 120. For example, a transmitter wireless device 110 may be a user equipment. Similarly, a receiver wireless device 111 may be a user equipment. In addition, the transmitter or receiver wireless device may be a base station. It is noted that the antennas of the wireless devices 110 and 111 may be antennas of a transceiver that may be used for both transmitting and receiving of a wireless signal. As such, each transmitter or receiver wireless device may be a transmitter or a receiver, based on whether the device is receiving or transmitting the wireless signal.

As described above, the transmit chain of a device, e.g., wireless device 110, includes several components. For example, the transmit chain may include: a baseband processor, a Digital Front End (DFE) processor, a Local Oscillator (LO), an upconverter, an antenna, etc. The baseband processor may determine In-phase (I) and Quadrature (Q) components of the data (input). The I and Q components of the data may also be jointly referred to as "IQ data." The baseband processor may then provide the IQ data to the DFE processor. When the transmitter is a digital transmitter, the upconverter may comprise a Radio Frequency Digital to Analog Converter (RFDAC). When the transmitter is an analog transmitter, the upconverter may comprise: a baseband Digital to Analog Converter (DAC), an optional post-filter, and an IQ mixer.

The present disclosure describes a wireless device that provides a dedicated synchronizer. For example, in addition to the various components describes above, the wireless device of the present disclosure also provides a dedicated synchronizer. The dedicated synchronizer is for performing a DFS in the transmit device in a synchronized manner, thereby reducing unwanted phase transients and phase errors.

Figure 2:
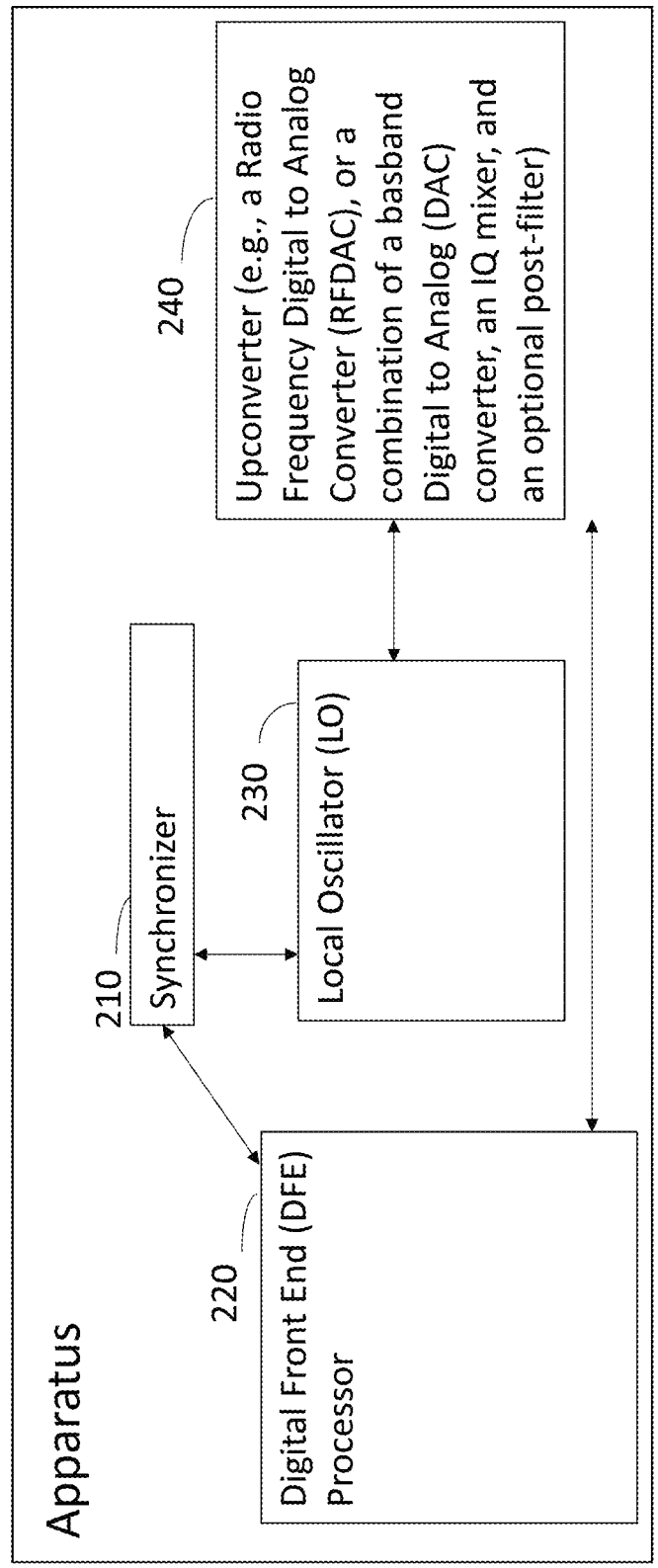
FIG. 2 illustrates an exemplary apparatus for synchronizing a DFS for a signal to be transmitted over a wireless channel in accordance with the teachings of the present disclosure.

FIG. 2 illustrates an apparatus 200 for synchronizing a DFS for a signal to be transmitted over a wireless channel in accordance with the teachings of the present disclosure. The apparatus 200 is comprised within each transmitter wireless device 110 described above with respect to FIG. 1. The apparatus 200 comprises a synchronizer 210, a DFE processor 220, a LO 230, and an upconverter 240. In one aspect, the synchronizer 210 is a dedicated hardware.

Figure 2A:
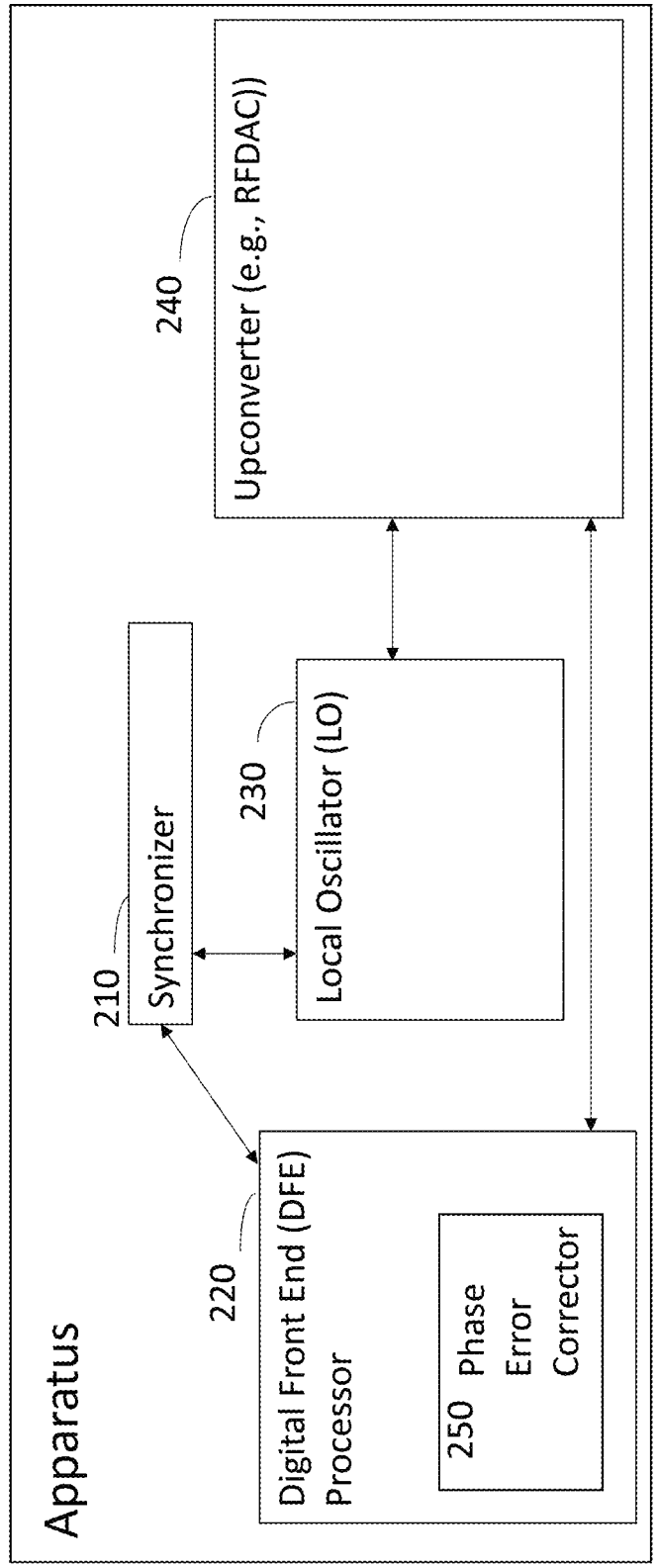
Figure 2B:
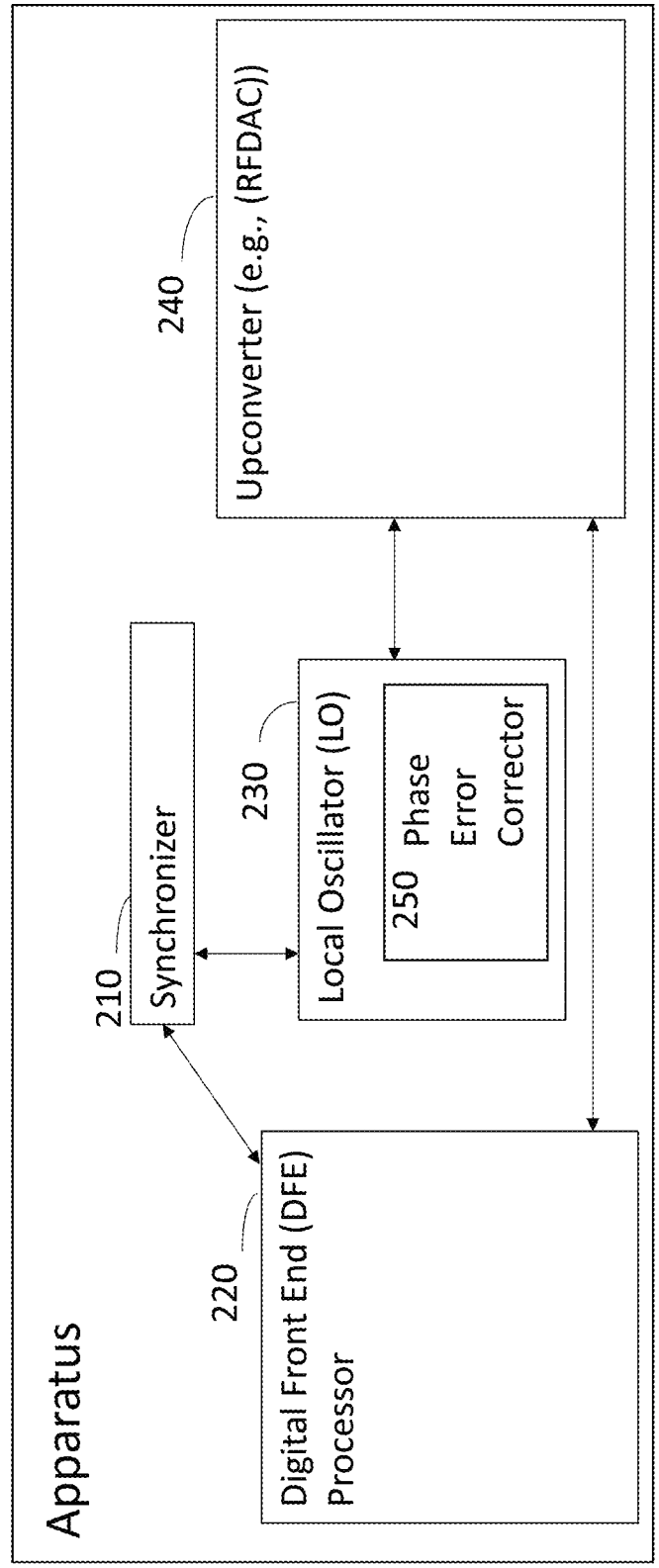

In one aspect, the apparatus 200 also comprises a phase error corrector 250. In one aspect, the phase error corrector 250 is arranged to be part of the DFE processor 220, as shown in FIG. 2A. In another aspect, the phase error corrector 250 is arranged to be part of the LO 230, as shown in FIG. 2B.

The synchronizer 210 is operatively coupled to the DFE processor 220 and the LO 230. The DFE processor 220 and the LO 230 are operatively coupled to the upconverter 240.

In order to reduce phase transients, the synchronizer 210 is configured to transmit a DFS trigger to the DFE processor and an LO trigger to the LO in a synchronous manner. The DFS trigger is transmitted by the synchronizer 210 to trigger a DFS in the DFE processor. Similarly, the LO trigger is transmitted to the LO to trigger a complementary shift in the LO.

For clarity, the trigger transmitted by the synchronizer to the DFE processor is referred to as a "DFE trigger" and the trigger transmitted by the synchronizer to the LO is referred to as a "LO trigger." When the type of LO is a phase-locked-loop, the trigger may also be referred to as a "PLL trigger." In addition, it is noted that the shift in the LO is referred to as a "complementary shift" because the magnitude of the frequency offset performed by the LO is equal to the magnitude of frequency shift (i.e., the DFS) performed by the DFE processor, and the direction of frequency offset caused by the complementary shift is opposite to the direction of frequency offset caused by the shift in the DFE processor. In other words, the DFE trigger and OL trigger are sent in a synchronized manner such that the complementary shift and the DFS cancel each other when the RF modulation is performed by the upconverter.

The DFE processor 220 is configured to apply the DFS on received data in response to receiving the DFE trigger from the synchronizer 210. For example, the DFE processor receives the data (e.g., the IQ data), applies a DFS on the received data in response to receiving a DFS trigger, processes the data, and provides the processed data to the upconverter 240. For example, the processing of the data by the DFE processor may include: converting from a first sampling rate to a second sampling rate, pulse shaping, filtering, performing gain control, etc.

The LO 230 is configured to apply a complementary shift on the carrier signal in response to receiving the LO trigger. For example, the LO 230 generates a carrier signal, applies a complementary shift on the carrier signal in response to receiving an LO trigger from the synchronizer 210, and provides the complementary-shifted carrier signal to the upconverter 240. In one aspect, the upconverter comprises an RFDAC. In another aspect, the upconverter comprises a baseband DAC, an optional post-filter, and an IQ mixer.

The upconverter 240 is configured to digital-to-analog convert and Radio Frequency (RF) modulate the digital frequency-shifted received data and the complementary-shifted carrier signal. The output of the RFDAC 240 is provided to an antenna for transmission. In other words, the data is encoded using the complementary-shifted carrier signal by performing RF modulation.

Note that the signal paths from the synchronizer 210 to the locations at which the DFS and the complementary shift (i.e., the shift in the LO) are unlikely to be the same. Similarly, the signal path between the LO and the upconverter is unlikely to be the same as the signal path between the DFE processor and the upconverter. The synchronizer 210 performs the synchronization of the DFE trigger and the LO trigger taking into account the differences in propagation delays for triggering the shifts at the two locations and for the two shifts to arrive at the upconverter. Moreover, in one aspect, the correcting of the phase error may be to compensate for the difference in arrival times of the two shifts at the upconverter.

In one aspect, the synchronizer 210 is further configured to determine the phase error and transmit the phase error to a phase error corrector 250. The phase error corrector is configured to phase error correct the digital frequency-shifted received data or the complementary-shifted carrier signal, based on the determined phase error.

The phase error correction provides additional advantages for some applications. For instance, suppose a device uses a transmitted signal as a reference for compensating for unwanted effects. Then, reducing static phase errors may be advantageous. For such applications, the phase error correction may be for removing static phase errors that cause phase discontinuities between consecutive data symbols.

In one aspect, the phase error correction is performed in a phase corrector arranged in the DFE processor. In one aspect, the phase error correction comprises rotating the In-phase and Quadrature components (i.e., the IQ data) to compensate for the phase error after applying the DFS. For example, the phase error correction may be to phase error correct the digital frequency-shifted received data. In one aspect, the phase error is created due to different arrival times of the DFS and complementary shifts at the upconverter 240.

In one aspect, the phase error correction is performed by a phase corrector arranged in the LO. In one aspect the phase error correction comprises adjusting a phase of the complementary-shifted carrier signal.

In one aspect, the phase error correction comprises applying DFS with a fractional delay in relation to the complementary shift in the LO. For example, a finer adjustment in the amount of DFS may be made to compensate for the additional phase error.

In one aspect, the synchronizer 210 of the present disclosure compensates for differences in sampling strobe rates used by the DFE processor 220 and the LO 230. For example, the synchronizer 210 transmits the DFS trigger and the LO trigger in a synchronous manner while compensating for differences in sampling strobe rates used by the DFE processor and the LO. In addition, the synchronizer 210 has knowledge of a common clock rate of the device that is used for all blocks of the device. Note that the common clock rate, the sampling strobe rate of the DFE processor and the sampling strobe rate of the LO may all be different. The common clock rate and the sampling strobe rates for the DFE processor and LO are further described below, in Example-1 and FIG. 3.

The synchronizer 210 monitors sampling strobes of the DFE processor 220 and the LO 230. In addition, the synchronizer 210 is configured to have knowledge of:

ideal application times of the DFS and complementary shift at the LO;

a first latency, where the first latency is a latency for a signal to traverse from a first location to a second location, the first location being a location of the DFE processor at which the DFS is applied and the second location being a location of the upconverter at which the digital frequency-shifted received data and the complementary shifted carrier signal are mixed;

a second latency, where the second latency is a latency for a signal to traverse from a location of the LO at which the complementary shift is applied to the location of the upconverter at which the digital frequency-shifted received data and the complementary shifted carrier signal are mixed; or a predetermined number of strobes to count for compensating for a difference between the first and second latencies.

In one aspect, the first latency is longer than the second latency. When the first latency is longer than the second latency, the synchronizer 210 computes the absolute time for triggering the DFS by subtracting the first latency from the ideal application time of the DFS.

In another aspect, the first latency is shorter than the second latency. When the first latency is shorter than the second latency, the synchronizer 210 computes the absolute time for triggering the complementary shift in the LO by subtracting the second latency from the ideal application time of the complementary shift in the LO.

The synchronizer 210 also monitors to determine whether a DFS event is triggered. The DFS event may be triggered by a Task List Processor (TLP) or a separate timer. When the DFS event is triggered, the synchronizer 210 may receive: a time for performing the DFS and a frequency shift (in Hertz) to be performed on received data, e.g., on IQ data. As noted above the DFE processor receives the IQ data from the baseband processor.

When the synchronizer 210 determines that a DFS event is triggered, the synchronizer transmits a DFS trigger to the DFE processor and an LO trigger to the LO in a synchronous manner for performing the DFS and the complementary shift, respectively.

The transmitting of the DFS trigger and the LO trigger in a synchronous manner may be implemented in a variety of aspects based on application. Examples 1-2 describe two aspects.

EXAMPLE-1

In one aspect, the transmitting of the DFS trigger to the DFE processor and the LO trigger to the LO in a synchronous manner comprises:

(1) Releasing a first trigger, wherein the first trigger is associated with the longer of the first latency and the second latency. The releasing of the first trigger applies either the DFS or the complementary shift, based on which shift is associated with the longer latency. For example, if the first latency (i.e., the latency of the DFE processor) is longer than the second latency, the first trigger is a DFE trigger and the DFS is applied in the DFE. In contrast, if the first latency is shorter than the second latency, the first trigger is an LO trigger and the complementary shift is applied in the LO.

(2) Starting a counter, referred to as a "delta counter", for determining a time between when the first trigger is released, as described in (1), and detection of a first strobe associated with a second trigger that is to be released. For example, if the first trigger released in (1) is a DFE trigger, the delta counter is used to count a time until the first strobe of the LO is detected after the DFE trigger is released. Similarly, if the first trigger released in (1) is an LO trigger, the delta counter is used to count the time until the first strobe of the DFE processor is detected after the LO trigger is released.

(3) Starting a strobes counter for counting a predetermined number of strobes for compensating for a difference between the first and second latencies. The predetermined number of strobes for compensating for the difference is known by the synchronizer.

(4) Stopping the delta counter upon detecting the first strobe associated with the second trigger that is to be released.

(5) If a phase error correction is implemented, determining a phase error. The determined phase error is computed from a frequency shift, the value of the delta counter, the values of the first and second latencies, the predetermined number of strobes for compensating for the difference between the first and second latencies, the sampling strobe rate (i.e., sampling clock rate) associated with the second trigger, and the common clock rate.

(6) When (5) is applicable, transmitting the determined phase error to the phase error corrector 250. The phase error corrector may be arranged to be either in the DFE processor 220 or LO 230.

(7) Releasing the second trigger when a value of the strobes counter reaches the predetermined number of strobes for compensating for the difference between the first and second latencies. The releasing of the second trigger applies the shift associated with the shorter latency.

EXAMPLE-2

In one aspect, the transmitting of the DFS trigger to the DFE processor and the LO trigger to the LO in a synchronous manner comprises:

(1) Releasing a first trigger, wherein the first trigger is associated with the longer of the first latency and the second latency. The releasing of the first trigger applies either the DFS or the complementary shift, based on which shift is associated with the longer latency.

(2) Starting a delta counter for determining a time between when the first trigger is released, as described in (1), and when a second trigger is to be released.

(3) Starting a strobes counter for counting a predetermined number of strobes for compensating for a difference between the first and second latencies.

(4) Detecting the first strobe associated with the second trigger that is to be released and determining a time for the second trigger. In one aspect, the time for the second trigger is determined from the predetermined number of strobes for compensating for the difference between the first and second latencies, a known strobes period, and a value of the delta counter when the second trigger is released.

(5) If a phase error correction is implemented, determining a phase error. The determined phase error is computed from a frequency shift, the value of the delta counter, the values of the first and second latencies, the sampling strobe rate (i.e., sampling clock rate) associated with the second trigger, and the common clock rate.

(6) When (5) is applicable, transmitting the determined phase error to the phase error corrector 250.

(7) Stopping the delta counter and releasing the second trigger when a value of the strobes counter reaches the predetermined number of strobes for compensating for the difference between the first and second latencies. The releasing of the second trigger applies the shift associated with the shorter latency.

Note that, with the exception of the value of the delta counter, the synchronizer may have knowledge of values for computing the phase error prior to receiving the DFS event. Hence, in one aspect, as soon as the first strobe of the second trigger is detected, the phase error can be computed. Example-3, described below, further illustrates the computation of the phase error using aspects of Example-1, described above. It is important to note that values needed for the computation for which the synchronizer may not already have knowledge, the synchronizer may obtain the values when needed. For example, latency values may be retrieved from a database.

In one aspect, the phase error is determined without a delta counter. For example, the distances of both strobes and the strobe rates may be known. For instance, suppose both strobes are started at the same time or with a known (i.e., well-defined) distance. Then, for each strobe, a number of strobes until the DFS event is triggered may be counted. Then, the strobe distance may be computed, without the delta counter, from the known strobe rates. This would allow to calculate the phase correction value at the first trigger (e.g. DFE trigger or LO trigger, based on which trigger is the first trigger).

EXAMPLE-3: COMPUTATION OF THE PHASE ERROR CORRECTION

As described above in Example-1, the determined phase error may be computed from the frequency shift, the value of the delta counter, the values of the first and second latencies, the predetermined number of strobes for compensating for the difference between the first and second latencies, the sampling strobe rate associated with the second trigger, and the common clock rate. The determined phase error is computed below for the scenario in which the upconverter is an RFDAC. However, if the transmitter is an analog transmitter, the latencies are defined from a location of the DFE or LO at which the DFS shift or complementary shift is applied to the location of the upconverter at which the mixing occurs.

For ease of understanding, let:
fshift: the amount of frequency shift,
c_delta: final counter value of the delta counter,
T_DFE: latency of DFE processor from a location of the DFE processor at which the DFS is applied to the RFDAC,
T_PLL: latency of LO from application of the complementary frequency shift at the LO to the RFDAC,
P: a predetermined number of LO strobes to count to compensate for a latency difference between T_DFE and T_PLL, when T_DFE is longer than T_PLL,
D: a predetermined number of DFE processor strobes to count to compensate for a latency difference between T_PLL and T_DFE, when T_PLL is longer than T_DFE,
fs_LO: a sampling strobe rate associated with the LO (i.e., a sampling rate of the LO),
fs_DFE: a sampling strobe rate associated with the DFE processor (i.e., a sampling rate of the DFE processor,
fs_clk: a clock rate common to all blocks,
t_delta: time between the first trigger and the second trigger (i.e., time between a DFS trigger followed by an LO trigger or a time between an LO trigger followed by a DFS trigger),
delta_error: remaining time error between the arrival times of the DFS and the complementary frequency shift at the RFDAC,
phase_error: delta_error converted to phase error,
phase_coeff: a scalar value used for converting c_delta to the phase_error, and
phi_off: a scalar value used for converting the c_delta to the phase_error.

Note that the values of t_delta, delta_error, phase_error, phase_coeff, and phi_off are computed from the other parameters. The equations for determining the values of t_delta, delta_error, phase_error, phase_coeff, and phi_off are provided below. The computation depends on whether the first trigger is for the DFE processor or for the LO.

When the first trigger is for the DFE processor:

$$t\_delta = (c\_delta/fs\_clk) + (P/fs\_LO), \quad \text{(Equation 1)}$$

$$delta\_error = t\_DFE - t\_PLL - t\_delta; \quad \text{(Equation 2)}$$

$$\begin{aligned}
phase\_error &= 2^* pi^* fshift^* delta\_error \\
&= 2^* pi^* fshift^* (t\_DFE - t\_PLL - t\_delta) \\
&= 2^* pi^* fshift^* (t\_DFE - t\_PLL - \\
&\quad (c\_delta/fs\_clk) - (P/fs\_LO)) \\
&= 2^* pi^* fshift^* (t\_DFE - t\_PLL - (P/fs\_LO)) - \\
&\quad 2^* pi^* fshift^* (c\_delta/fs\_clk)), \\
&= phi\_off - phase\_coeff * c\_delta,
\end{aligned} \quad \text{(Equation 3)}$$

wherein, $$phi\_off = 2^*pi^*fshift^*(t\_DFE - t\_PLL - (P/fs\_LO)), \text{ and} \quad \text{(Equation 4)}$$

$$phase\_coeff = 2^*pi^*fshift/fs\_clk. \quad \text{(Equation 5)}$$

When the first trigger is for the LO:

$$t\_delta = (c\_delta/fs\_clk) + (D/fs\_DFE), \quad \text{(Equation 6)}$$

$$delta\_error = t\_PLL - t\_DFE - t\_delta; \quad \text{(Equation 7)}$$

$$\begin{aligned}
phase\_error &= 2^* pi^* fshift^* delta\_error \\
&= 2^* pi^* fshift^* (t\_PLL - t\_DFE - t\_delta) \\
&= 2^* pi^* fshift^* (t\_PLL - t\_DFE - \\
&\quad (c\_delta/fs\_clk) - (D/fs\_DFE)) \\
&= 2^* pi^* fshift^* (t\_PLL - t\_DFE - (D/fs\_DFE)) - \\
&\quad 2^* pi^* fshift^* (c\_delta/fs\_clk)), \\
&= phi\_off - phase\_coeff * c\_delta,
\end{aligned} \quad \text{(Equation 8)}$$

wherein, $$phi\_off = 2^*pi^*fshift^*(t\_PLL - t\_DFE - (D/fs\_DFE)), \text{ and} \quad \text{(Equation 9)}$$

$$phase\_coeff = 2^*pi^*fshift/fs\_clk. \quad \text{(Equation 10)}$$

Figure 3:
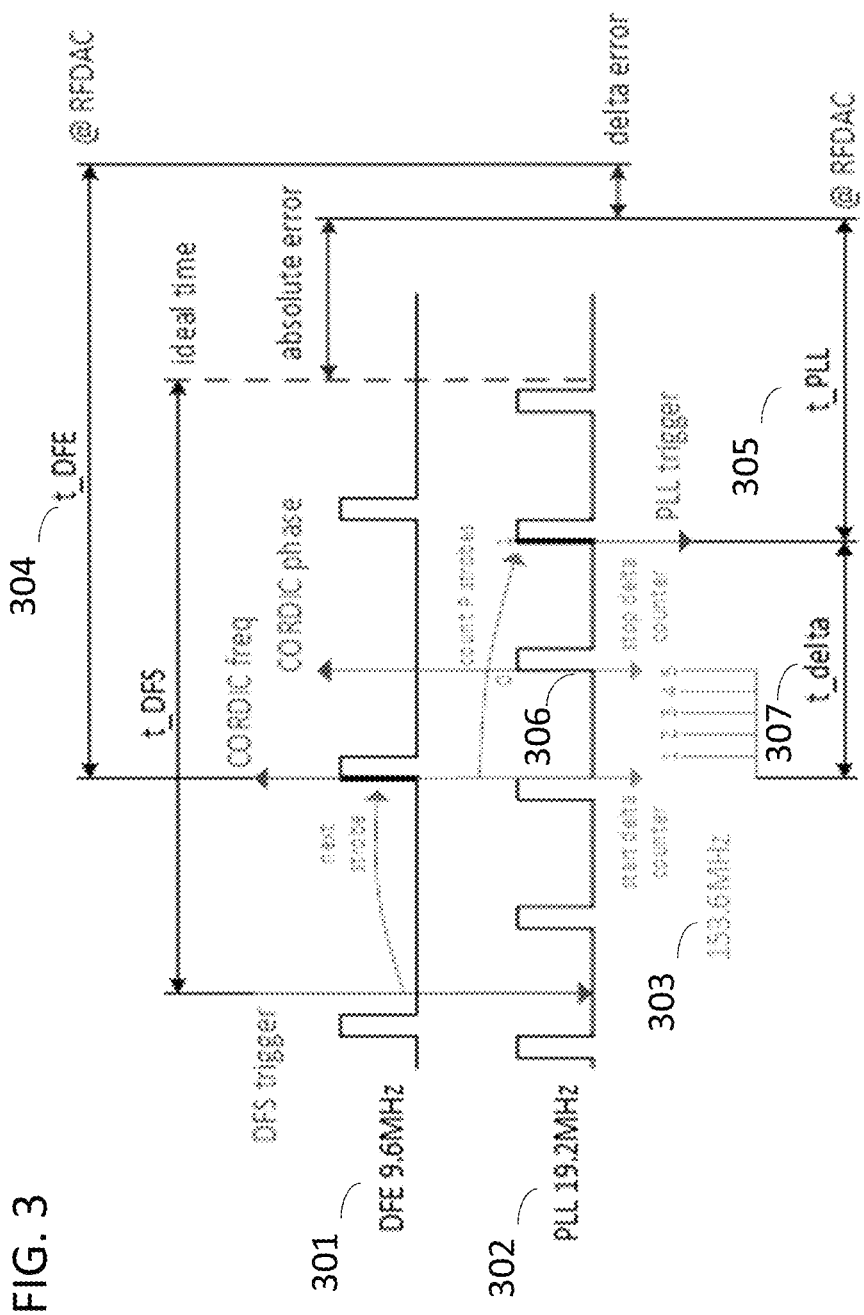
FIG. 3 illustrates an exemplary timing diagram in accordance with the present disclosure.

FIG. 3 illustrates a timing diagram 300 in accordance with the present disclosure. For the illustrative example, the sampling strobe rate 301 for the DFE processor (i.e., fs_DFE) is set to 9.6 MHz. Similarly, for the LO, the sampling strobe rate 302 (i.e., fs_LO) is set to 19.2 MHz. The common clock frequency 303 (i.e., fs_clk) is set to 153.6 MHz. The timing diagram 300 is for a scenario in which the t_DFE 304 is longer that the t_PLL 305. The value of c_delta is known as soon as the delta counter stops, as shown in 306. The time between application of the DFS and application of the complementary shift is shown in 307. Then, equations 1-5 may be used to determine the appropriate phase correction. It is noted that the illustration of FIG. 3 and the sampling strobe rates are exemplary and not intended to limit the implementation. As such, any other sampling strobe rate may be used.

Figure 4:
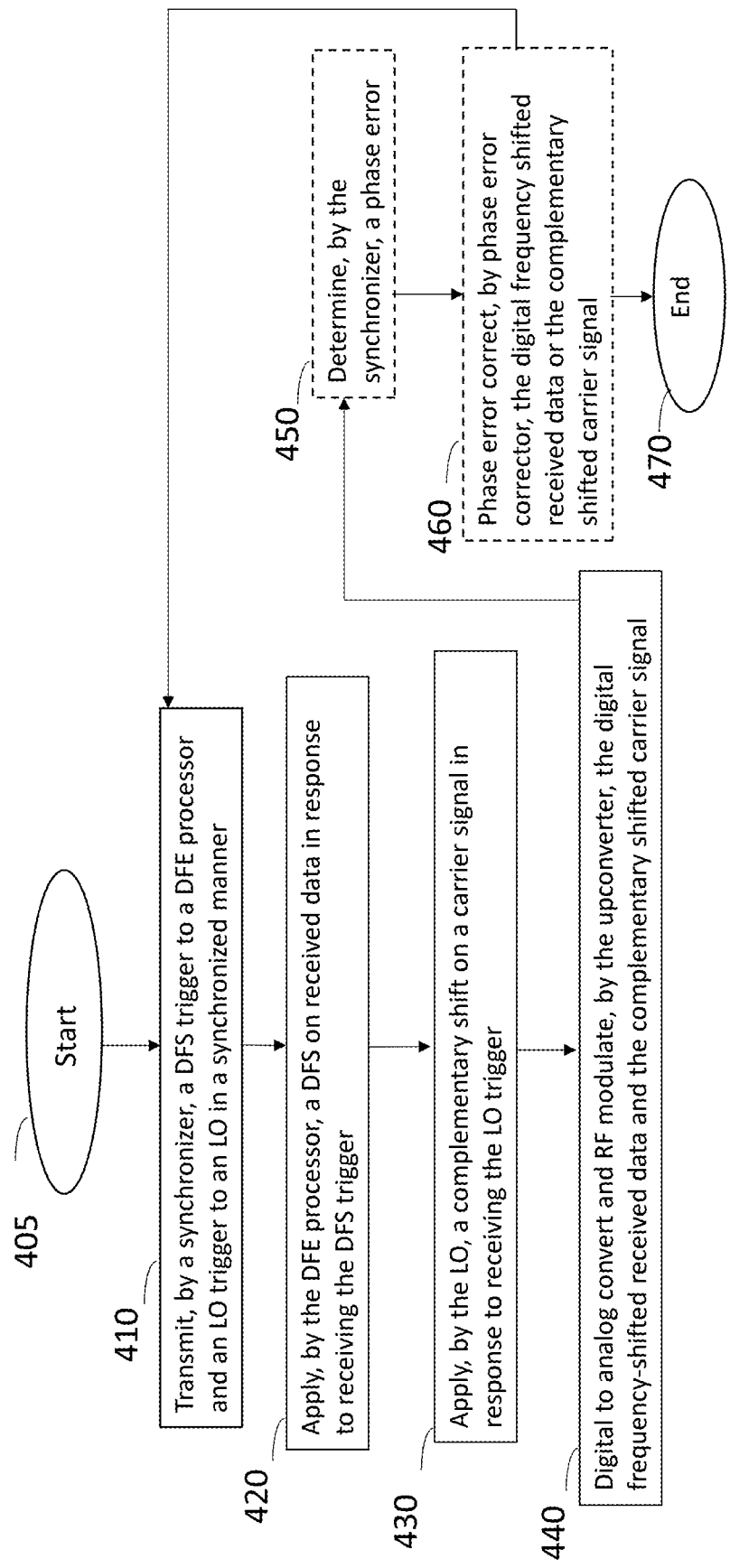
FIG. 4 illustrates a flowchart of an exemplary method for synchronizing a DFS in accordance with the present disclosure.

FIG. 4 illustrates a flowchart of an example method 400 for synchronizing a Digital Frequency Shift (DFS) in accordance with the present disclosure.

In one aspect of the present disclosure, the method 400 may be implemented in a wireless device that comprises one or more antennas configured to transmit a wireless signal and an apparatus, e.g., apparatus 200, for synchronizing a DFS for the signal to be transmitted over the wireless channel. For example, the method 400 may be implemented in an apparatus 200 wherein the synchronizing is performed by synchronizer 210, applying a DFS is performed by DFE processor 220, applying a complementary shift is performed by LO 230, and the digital to analog converting and RF modulating are performed by upconverter 240, as described above. In another example, the method 400 may be implemented in an apparatus 200 wherein phase error correcting is performed by phase error corrector 250. In another example, the method 400 may be implemented in a device 500, described below.

The method 400 starts in a step 405 and proceeds to step 410.

In step 410, the method, by a synchronizer 210, transmits a DFS trigger to a DFE processor and an LO trigger to an LO in a synchronous manner.

In step 420, the method, by the DFE processor 220, in response to receiving the DFS trigger, applies a DFS on received data.

In step 430, the method, by the LO 230, in response to receiving the LO trigger, applies a complementary shift on a carrier signal.

In step 440, the method, by the upconverter 240, digital-to-analog converts and radio frequency modulates the digital frequency-shifted received data and the complementary-shifted carrier signal.

In optional step 450, the method, by the synchronizer 210, determines a phase error and provides the determined phase error to a phase error corrector 250.

In optional step 460, the method, by the phase error corrector 250, phase error corrects the digital frequency-shifted received data or the complementary-shifted carrier signal, based on the determined phase error.

The method may then proceed to step 470 to end the synchronizing of the DFS or to step 405 to receive DFS events for triggering more synchronization of DFSs in accordance with the present disclosure.

Figure 5:
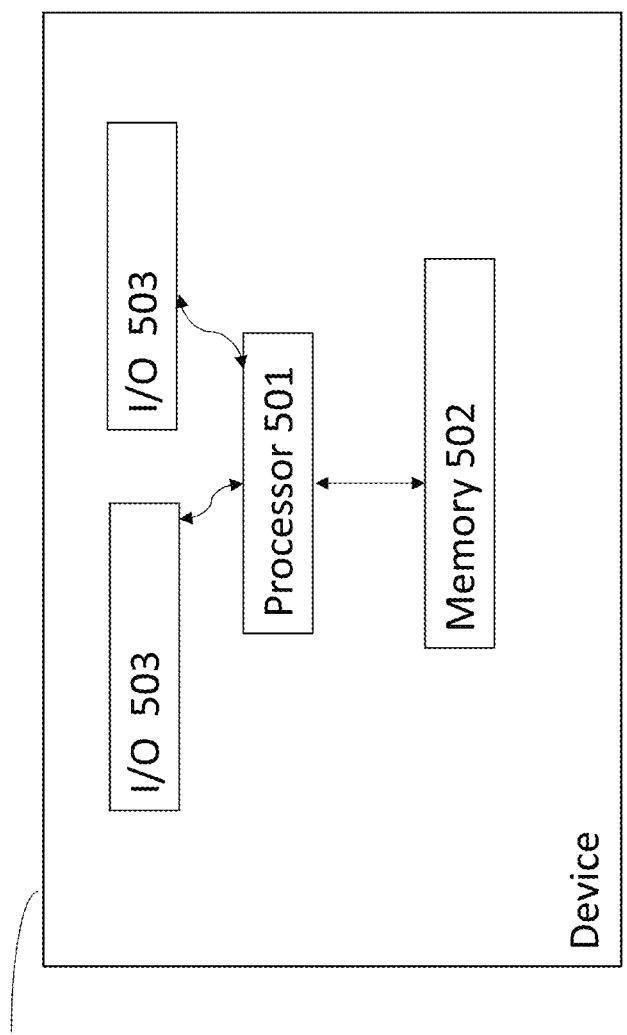
FIG. 5 illustrates an exemplary device for performing the functions described in the present disclosure.

FIG. 5 illustrates a device 500 for performing the function described in the present disclosure. The device 500 comprises a processor 501 and a memory 502 configured to store program instructions to be executed by the processor 501, where executing the program instructions causes the processor 501 to perform operations for synchronizing a DFS for a signal to be transmitted over a wireless channel, the operations comprise, transmitting a DFS trigger to a DFE processor and an LO trigger to an LO in a synchronous manner, applying a DFS on received data in response to receiving the DFS trigger, applying a complementary shift on a carrier signal in response to receiving the LO trigger, and digital to analog converting and RF modulating the digital frequency-shifted received data and the complementary-shifted carrier signal. In addition, the operations may further comprise performing a phase error correction. The device 500 may further comprise any number and type of input/output devices 503.

It is noted that although FIG. 5 illustrates a single device, the method 400 may be implemented via any number of devices performing the operations of method 400 in a distributed manner, serial manner, or a combination thereof. In addition, the devices may be virtualized devices instantiated on servers (e.g., servers of a cloud network). As such, the representation of the hardware components of the device may be a virtualized or a physical representation, without departing from the teaching of the present disclosure. Accordingly, the method 400 may be implemented in hardware, software, or a combination thereof. It is noted that the processor 501 executing the program instructions includes the processor 501 performing the operations of the method 400 directly or indirectly. For example, the processor 501 may perform the operations in conjunction with other devices or may direct another device to perform the operations.

The following examples pertain to further embodiments.

Example 1 is an apparatus for synchronizing a Digital Frequency Shift (DFS) for a signal to be transmitted over a wireless channel, the apparatus comprising: a synchronizer configured to transmit a DFS trigger and a Local Oscillator (LO) trigger in a synchronous manner; a Digital Front End (DFE) processor, operatively coupled to the synchronizer, and configured to, in response to receiving the DFS trigger, apply a DFS on received data; an LO, operatively coupled to the synchronizer, and configured to, in response to receiving the LO trigger, apply a complementary shift on a carrier signal; and an upconverter operatively coupled to the DFE processor and the LO, and configured to digital-to-analog convert and radio frequency modulate the digital frequency-shifted received data and the complementary-shifted carrier signal.

In Example 2, the subject matter of Example 1, wherein the synchronizer is further configured to determine a phase error of the digital frequency-shifted received data, and wherein the apparatus further comprises: a phase error corrector configured to phase error correct the digital frequency-shifted received data or the complementary-shifted carrier signal, based on the determined phase error.

In Example 3, the subject matter of Example 2, wherein the phase error corrector is arranged to be part of the DFE processor.

In Example 4, the subject matter of Example 3, wherein the phase error correction comprises rotating In-phase and Quadrature components of the digital frequency-shifted received data.

In Example 5, the subject matter of Example 3, wherein a phase error correction comprises applying the DFS with a fractional delay in relation to the complementary shift in the LO.

In Example 6, the subject matter of Example 2, wherein the phase error corrector is arranged to be part of the LO.

In Example 7, the subject matter of Example 6, wherein the phase error correction comprises adjusting a phase of the complementary-shifted carrier signal.

In Example 8, the subject matter of Example 2, wherein the phase error correction is based on differences in arrival times of the DFS and the complementary shift at the upconverter.

In Example 9, the subject matter of Example 1, wherein the synchronizer is a dedicated hardware.

In Example 10, the subject matter of Example 1, wherein the synchronizer is configured to transmit the DFS trigger to the DFE processor and the LO trigger to the LO upon a DFS event being triggered.

In Example 11, the subject matter of Example 10, wherein the DFS event is triggered by a task list processor or a separate timer.

In Example 12, the subject matter of Example 10, wherein the synchronizer is configured to receive, when the DFS event is triggered, a frequency shift to be performed on the received data.

In Example 13, the subject matter of Example 1, wherein the synchronizer is configured to have knowledge of: ideal application times of the DFS and complementary shift at the LO, a first latency, where the first latency is a latency for a signal to traverse from a first location to a second location, the first location being a location of the DFE processor at which the DFS is applied and the second location being a location of the upconverter at which the digital frequency-shifted received data and the complementary shifted carrier signal are mixed, a second latency, where the second latency is a latency for a signal to traverse from a location of the LO at which the complementary shift is applied to the location of the upconverter at which the digital frequency-shifted received data and the complementary shifted carrier signal are mixed, or a predetermined number of strobes to count for compensating for a difference between the first and second latencies.

In Example 14, the subject matter of Example 13, wherein the synchronizer configured to transmit the DFS trigger and the LO trigger in the synchronous manner comprises configuring for: releasing a first trigger, wherein the first trigger is associated with a longer of the first latency and the second latency; starting a delta counter for determining a time between when the first trigger is released and detection of a first strobe associated with a second trigger that is to be released; starting a strobe counter for counting a predetermined number of strobes for compensating for a difference between the first and second latencies; detecting the first strobe associated with the second trigger that is to be released; and releasing the second trigger when a value of the strobe counter reaches the predetermined number of strobes for compensating for the difference between the first and second latencies.

In Example 15, the subject matter of Example 14, wherein the synchronizer is configured to: determine a phase error; and transmit the determined phase error to a phase error corrector.

In Example 16, the subject matter of Example 15, wherein the determined phase error is computed from a frequency shift, the value of the delta counter, the values of the first and second latencies, the predetermined number of strobes for compensating for the difference between the first and second latencies, a sampling strobe rate associated with the second trigger, and a common clock rate.

In Example 17, the subject matter of Example 10, wherein the first latency is longer than the second latency.

In Example 18, the subject matter of Example 10, wherein the first latency is shorter than the second latency.

In Example 19, the subject matter of Example 1, wherein the synchronizer transmits the DFS trigger to the DFE processor and the LO trigger to the LO in a synchronous manner while compensating for differences in sampling strobe rates used by the DFE processor and the LO.

Example 20 is a wireless device, comprising: one or more antennas configured to transmit a signal; and the apparatus for synchronizing a DFS for the signal to be transmitted over a wireless channel of Example 1.

In Example 21, the subject matter of Example 20, wherein the synchronizer is further configured to determine a phase error and provide the phase error to a phase error corrector configured to perform phase error correction.

Example 22 is a method for synchronizing a Digital Frequency Shift (DFS) for a signal to be transmitted over a wireless channel, the method comprising: transmitting, by a synchronizer, a DFS trigger to a Digital Front End (DFE) processor and a Local Oscillator (LO) trigger to an LO in a synchronous manner; applying, by the DFE processor, in response to receiving the DFS trigger a DFS on received data; applying, by the LO, in response to receiving the LO trigger a complementary shift on a carrier signal; and digital-to-analog converting and radio frequency modulating, by an upconverter, the digital frequency-shifted received data and the complementary-shifted carrier signal.

In Example 23, the subject matter of Example 22, further comprising: determining, by the synchronizer, a phase error in the digital frequency-shifted received data; and phase error correcting, by a phase error corrector, the digital frequency-shifted received data or the complementary-shifted carrier signal, based on the determined phase error.

Example 24 is a device, comprising: a processor; and a memory configured to store a program instructions to be executed by the processor, where executing the program instructions causes the processor to perform operations for synchronizing a Digital Frequency Shift (DFS) for a signal to be transmitted over a wireless channel, the operations comprising: transmitting, by a synchronizer, a DFS trigger to a Digital Front End (DFE) processor and a Local Oscillator (LO) trigger to an LO in a synchronous manner; applying, by the DFE processor in response to receiving the DFS trigger, a DFS on received data; applying, by the LO in response to receiving the LO trigger, a complementary shift on a carrier signal; and digital-to-analog converting and radio frequency modulating, by an upconverter, the digital frequency-shifted received data and the complementary-shifted carrier signal.

In Example 25, the subject matter of Example 24, the operations further comprising: determining, by the synchronizer, a phase error in the digital frequency-shifted received data; and phase error correcting, by a phase error corrector, the digital frequency-shifted received data or the complementary-shifted carrier signal, based on the determined phase error.

Example 26 is a n apparatus for synchronizing a Digital Frequency Shift (DFS) for a signal to be transmitted over a wireless channel, the apparatus comprising: a synchronizing means for transmitting transmit a DFS trigger and a Local Oscillator (LO) trigger in a synchronous manner; a Digital Front End (DFE) processing means, operatively coupled to the synchronizer, and for, in response to receiving the DFS trigger, applying a DFS on received data; an LO, operatively coupled to the synchronizing means, and for, in response to receiving the LO trigger, applying a complementary shift on a carrier signal; and an upconverting means operatively coupled to the DFE processor and the LO, and for digital-to-analog converting and radio frequency modulating the digital frequency-shifted received data and the complementary-shifted carrier signal.

In Example 27, the subject matter of Example 26, wherein the synchronizing means is further for determining a phase error of the digital frequency-shifted received data, and wherein the apparatus further comprises: a phase error correcting means for to phase error correcting the digital frequency-shifted received data or the complementary-shifted carrier signal, based on the determined phase error.

In Example 28, the subject matter of Example 27, wherein the phase error correcting means is arranged to be part of the DFE processing means.

In Example 29, the subject matter of Example 28, wherein the phase error correction comprises rotating In-phase and Quadrature components of the digital frequency-shifted received data.

In Example 30, the subject matter of Example 28, wherein a phase error correction comprises applying the DFS with a fractional delay in relation to the complementary shift in the LO.

In Example 31, the subject matter of Example 27, wherein the phase error correcting means is arranged to be part of the LO.

In Example 32, the subject matter of Example 31, wherein the phase error correction comprises adjusting a phase of the complementary-shifted carrier signal.

In Example 33, the subject matter of Example 27, wherein the phase error correction is based on differences in arrival times of the DFS and the complementary shift at the upconverter.

In Example 34, the subject matter of Example 26, wherein the synchronizing means is a dedicated hardware.

In Example 35, the subject matter of Example 26, wherein the synchronizing means is for transmitting the DFS trigger to the DFE processor and the LO trigger to the LO upon a DFS event being triggered.

In Example 36, the subject matter of Example 35, wherein the DFS event is triggered by a task list processor or a separate timer.

In Example 37, the subject matter of Example 35, wherein the synchronizing means is for receiving, when the DFS event is triggered, a frequency shift to be performed on the received data.

In Example 38, the subject matter of Example 26, wherein the synchronizing means has knowledge of: ideal application times of the DFS and complementary shift at the LO, a first latency, where the first latency is a latency for a signal to traverse from a first location to a second location, the first location being a location of the DFE processor at which the DFS is applied and the second location being a location of the upconverter at which the digital frequency-shifted received data and the complementary shifted carrier signal are mixed, a second latency, where the second latency is a latency for a signal to traverse from a location of the LO at which the complementary shift is applied to the location of the upconverter at which the digital frequency-shifted received data and the complementary shifted carrier signal are mixed, or a predetermined number of strobes to count for compensating for a difference between the first and second latencies.

In Example 39, the subject matter of Example 38, wherein the synchronizing means is for transmitting the DFS trigger and the LO trigger in the synchronous manner comprises: releasing a first trigger, wherein the first trigger is associated with a longer of the first latency and the second latency; starting a delta counter for determining a time between when the first trigger is released and detection of a first strobe associated with a second trigger that is to be released; starting a strobe counter for counting a predetermined number of strobes for compensating for a difference between the first and second latencies; detecting the first strobe associated with the second trigger that is to be released; and releasing the second trigger when a value of the strobe counter reaches the predetermined number of strobes for compensating for the difference between the first and second latencies.

In Example 40, the subject matter of Example 39, wherein the synchronizing means is for: determining a phase error; and transmitting the determined phase error to a phase error corrector.

In Example 41, the subject matter of Example 40, wherein the determined phase error is computed from a frequency shift, the value of the delta counter, the values of the first and second latencies, the predetermined number of strobes for compensating for the difference between the first and second latencies, a sampling strobe rate associated with the second trigger, and a common clock rate.

In Example 42, the subject matter of Example 35, wherein the first latency is longer than the second latency.

In Example 43, the subject matter of Example 35, wherein the first latency is shorter than the second latency.

In Example 44, the subject matter of Example 26, wherein the synchronizing means is for transmitting the DFS trigger to the DFE processor and the LO trigger to the LO in a synchronous manner while compensating for differences in sampling strobe rates used by the DFE processor and the LO.

Example 45 is a wireless device, comprising: one or more antennas configured to transmit a signal; and the apparatus for synchronizing a DFS for the signal to be transmitted over a wireless channel of Example 26.

In Example 46, the subject matter of Example 45, wherein the synchronizing means is further for determining a phase error and provide the phase error to a phase error corrector configured to perform phase error correction.

It should be understood that the aspects of the present disclosure are described above by way of examples. However, the various aspects are exemplary and not limitations. Thus, the scope of the present disclosure should not be construed as being limited by any of the above aspects or examples. The breadth and the scope of the present disclosure should be defined in accordance with the scope and breadth of the following claims and/or equivalents.

What is claimed is:

1. An apparatus for synchronizing a Digital Frequency Shift (DFS) for a signal to be transmitted over a wireless channel, the apparatus comprising:
    a synchronizer configured to transmit a DFS trigger and a Local Oscillator (LO) trigger in a synchronous manner;
    a Digital Front End (DFE) processor, operatively coupled to the synchronizer, and configured to, in response to receiving the DFS trigger, apply a DFS on received data to provide digital frequency-shifted received data;
    a LO, operatively coupled to the synchronizer, and configured to, in response to receiving the LO trigger, apply a complementary shift on a carrier signal to provide a complementary-shifted carrier signal; and
    an upconverter operatively coupled to the DFE processor and the LO, the upconverter being configured to digital-to-analog convert the digital frequency-shifted received data to provide converted frequency-shifted received data, and radio frequency modulate the converted frequency-shifted received data with the complementary-shifted carrier signal,
    wherein the synchronizer is configured to transmit the DFS trigger and the LO trigger to compensate for differences in arrival times of the DFS and the complementary-shift with respect to when the digital frequency-shifted received data and the complementary-shifted carrier signal each arrive at the upconverter.

2. The apparatus of claim 1,
wherein the synchronizer is further configured to determine a phase error of the digital frequency-shifted received data, and
further comprising:
a phase error corrector configured to phase error correct the digital frequency-shifted received data or the complementary-shifted carrier signal based on the determined phase error.

3. The apparatus of claim 2, wherein the phase error corrector is arranged to be part of the DFE processor.

4. The apparatus of claim 2, wherein the phase error correction comprises rotating In-phase (I) and Quadrature-phase (Q) components of the digital frequency-shifted received data.

5. The apparatus of claim 2, wherein the phase error corrector is configured to perform phase error correction by applying the DFS with a fractional delay in relation to the complementary shift on the carrier signal applied via the LO.

6. The apparatus of claim 2, wherein the phase error corrector is arranged to be part of the LO.

7. The apparatus of claim 6, wherein the phase error correction comprises adjusting a phase of the complementary-shifted carrier signal.

8. The apparatus of claim 2, wherein the phase error correction is based on differences in arrival times of the DFS and the complementary shift on the carrier signal at the upconverter.

9. The apparatus of claim 1, wherein the synchronizer is a dedicated hardware.

10. The apparatus of claim 1, wherein the synchronizer is configured to (i) transmit the DFS trigger to the DFE processor, and (ii) transmit the LO trigger to the LO upon a DFS event being triggered.

11. The apparatus of claim 10, wherein the DFS event is triggered by a task list processor or a separate timer.

12. The apparatus of claim 10, wherein the synchronizer is configured to receive, when the DFS event is triggered, the DFS to be applied on the received data.

13. The apparatus of claim 1, wherein the synchronizer is configured to determine one or more of:
ideal application times of the DFS and complementary shift at the LO,
a first latency that is a latency for a signal to traverse from a first location to a second location, the first location being a location of the DFE processor at which the DFS is applied and the second location being a location of the upconverter at which the converted frequency-shifted received data and the complementary shifted carrier signal are mixed,
a second latency that is a latency for a signal to traverse from a location of the LO at which the complementary shift is applied to the location of the upconverter at which the converted frequency-shifted received data and the complementary shifted carrier signal are mixed, and
a predetermined number of strobes to be counted for compensating for a difference between the first latency and the second latency.

14. The apparatus of claim 13, wherein the synchronizer is configured to transmit the DFS trigger and the LO trigger comprising one or more of:
releasing a first trigger is associated with a longer of the first latency and the second latency;
starting a delta counter for determining a time between when the first trigger is released and a detection of a first strobe associated with a second trigger that is to be released;
starting a strobe counter for counting a predetermined number of strobes for compensating for a difference between the first latency and the second latency;
detecting the first strobe associated with the second trigger that is to be released; and
releasing the second trigger when a value of the strobe counter reaches the predetermined number of strobes to be counted for compensating for the difference between the first latency and the second latency.

15. The apparatus of claim 1, wherein the synchronizer is configured to:
determine a phase error; and
transmit the determined phase error to a phase error corrector.

16. The apparatus of claim 14, wherein the synchronizer is configured to determine a phase error, and
wherein the determined phase error is computed from a frequency shift, the value of the delta counter, the values of the first latency and the second latency, the predetermined number of strobes to be counted for compensating for the difference between the first latency and the second latency, a sampling strobe rate associated with the second trigger, and a common clock rate.

17. The apparatus of claim 10, wherein the synchronizer is configured to determine one or more of:
a first latency that is a latency for a signal to traverse from a first location to a second location, the first location being a location of the DFE processor at which the DFS is applied and the second location being a location of the upconverter at which the converted frequency-shifted received data and the complementary shifted carrier signal are mixed, and
a second latency that latency that is a latency for a signal to traverse from a location of the LO at which the complementary shift is applied to the location of the upconverter at which the converted frequency-shifted received data and the complementary shifted carrier signal are mixed,
wherein the first latency is longer than the second latency.

18. The apparatus of claim 10, wherein the synchronizer is configured to determine one or more of:
a first latency that is a latency for a signal to traverse from a first location to a second location, the first location being a location of the DFE processor at which the DFS is applied and the second location being a location of the upconverter at which the converted frequency-shifted received data and the complementary shifted carrier signal are mixed, and
a second latency that latency that is a latency for a signal to traverse from a location of the LO at which the complementary shift is applied to the location of the upconverter at which the converted frequency-shifted received data and the complementary shifted carrier signal are mixed,
wherein the first latency is shorter than the second latency.

19. The apparatus of claim 1, wherein the synchronizer transmits (i) the DFS trigger to the DFE processor and (ii) the LO trigger to the LO in a synchronous manner while compensating for differences in sampling strobe rates used by the DFE processor and the LO.

20. The apparatus of claim 1, further comprising:

one or more antennas configured to transmit the signal over the wireless channel.

21. A method for synchronizing a Digital Frequency Shift (DFS) for a signal to be transmitted over a wireless channel, the method comprising:

transmitting, by a synchronizer, a DFS trigger to a Digital Front End (DFE) processor and a Local Oscillator (LO) trigger to an LO in a synchronous manner;

applying, by the DFE processor, in response to receiving the DFS trigger a DFS on received data to provide digital frequency-shifted received data;

applying, by the LO in response to receiving the LO trigger a complementary shift on a carrier signal to provide a complementary-shifted carrier signal;

digital-to-analog converting, by an upconverter, the digital frequency-shifted received data to provide converted frequency-shifted received data; and radio frequency modulating, by the upconverter, the converted frequency-shifted received data with the complementary-shifted carrier signal, wherein the DFS trigger and the LO trigger are transmitted by the synchronizer to compensate for differences in arrival times of the DFS and the complementary-shift with respect to when the digital frequency-shifted received data and the complementary-shifted carrier signal each arrive at the upconverter.

22. The method of claim 21, further comprising:

determining, by the synchronizer, a phase error in the digital frequency-shifted received data; and phase error correcting, by a phase error corrector, the digital frequency-shifted received data or the complementary-shifted carrier signal, based on the determined phase error.

23. A device, comprising:

a processor; and a memory configured to store instructions to be executed by the processor, wherein executing the program instructions causes the processor to perform operations for synchronizing a Digital Frequency Shift (DFS) for a signal to be transmitted over a wireless channel, the operations comprising:

transmitting, by a synchronizer, a DFS trigger to a Digital Front End (DFE) processor and a Local Oscillator (LO) trigger to an LO in a synchronous manner to provide digital frequency-shifted received data;

applying, by the DFE processor in response to receiving the DFS trigger, a DFS on received data;

applying, by the LO in response to receiving the LO trigger, a complementary shift on a carrier signal to provide a complementary-shifted carrier signal;

digital-to-analog converting, by an upconverter, the digital frequency-shifted received data to provide converted frequency-shifted received data; and radio frequency modulating, by the upconverter, the converted frequency-shifted received data with the complementary-shifted carrier signal, wherein the DFS trigger and the LO trigger are transmitted by the synchronizer to compensate for differences in arrival times of the DFS and the complementary-shift with respect to when the digital frequency-shifted received data and the complementary-shifted carrier signal each arrive at the upconverter.

24. The device of claim 23, the operations further comprising:

determining, by the synchronizer, a phase error in the digital frequency-shifted received data; and phase error correcting, by a phase error corrector, the digital frequency-shifted received data or the complementary-shifted carrier signal, based on the determined phase error.

* * * * *